United States Patent
Inoue

[19]

[11] Patent Number: 6,153,447
[45] Date of Patent: Nov. 28, 2000

[54] LSI PACKAGE AND MANUFACTURING METHOD THEREOF

[75] Inventor: Tatsuo Inoue, Tokyo, Japan

[73] Assignee: NEC Corporation, Tokyo, Japan

[21] Appl. No.: 09/182,214

[22] Filed: Oct. 30, 1998

Related U.S. Application Data

[62] Division of application No. 08/819,007, Mar. 17, 1997, Pat. No. 5,861,664.

[30] Foreign Application Priority Data

Mar. 18, 1996 [JP] Japan ..................................... 8-088804

[51] Int. Cl.$^7$ ........................... H01L 21/44; H01L 21/48; H01L 21/50
[52] U.S. Cl. ........................... 438/106; 257/697; 361/748
[58] Field of Search ..................................... 257/693, 697, 257/700, 703; 361/748, 749, 750; 438/106

[56] References Cited

U.S. PATENT DOCUMENTS

| | | |
|---|---|---|
| 4,221,047 | 9/1980 | Narken et al. .............................. 29/840 |
| 4,407,007 | 9/1983 | Desai et al. .............................. 257/697 |

FOREIGN PATENT DOCUMENTS

| | | |
|---|---|---|
| 1119047 | 5/1989 | Japan . |
| 3227561 | 10/1991 | Japan . |

OTHER PUBLICATIONS

Patent Abstracts of Japan, Publication No. 57097660, Mukai Makoto, Jun. 21, 1982.
Patent Abstracts of Japan, Publication No. 01161801, Kikuchi Teruo, Jun. 26, 1989.
Patent Abstracts of Japan, Publication No. 01196198, Kon Taichi, Aug. 7, 1989.
Patent Abstracts of Japan, Publication No. 01119047, Misawa Hiroyuki, May 11, 1989.
R. Tummala et al, *Microelectronics Packaging Handbook*, 1989, vol. 2 Van Nostrand Reinhold, pp. 786–790.

*Primary Examiner*—Son T. Dinh
*Assistant Examiner*—Christian D. Wilson
*Attorney, Agent, or Firm*—Sughrue, Mion, Zinn, Macpeak & Seas, PLLC

[57] ABSTRACT

In an LSI package, terminal resistance elements are formed of resistive paste which, consisting of a mixture of fine powder of either oxidized metal or carbon and fine powder of glass, is buried and sintered in a ceramic wiring board in the direction to penetrate it. Front side wiring, connecting the parts of the terminal resistance elements exposed on the front face of the ceramic wiring board to input/output circuits of the LSI chip to be mounted on the front face of the ceramic wiring board, is formed on the front face of the ceramic wiring board and in the top layer of the ceramic wiring board. Back side wiring, connecting the parts of the terminal resistance elements exposed on the back face of the ceramic wiring board to a voltage clamp wiring network, is formed on the back face of the ceramic wiring board.

4 Claims, 4 Drawing Sheets

LSI PACKAGE AND MANUFACTURING METHOD THEREOF

This is a divisional of application Ser. No. 08/819,007 filed Mar. 17, 1997, issued as U.S. Pat. No. 5,861,664 the disclosure of which is incorporated herein by reference.

BACKGROUND OF THE INVENTION

The present invention relates to an LSI package in which large scale integrated circuits (LSIs) for use in computers and other electronic apparatuses are installed in high density and a manufacturing method thereof, and more particularly to an LSI package having a built-in terminal resistor and a manufacturing method thereof.

In recent years, most of the main functional blocks of electronic apparatuses including computers above all, other data processing equipment and communication systems have come to be incorporated into LSIs to meet the need for ever faster processing. If LSIs become even larger in the scale of integration to enable a plurality of functional blocks to be incorporated into a single LSI chip, wiring between functional blocks will be shortened to further enhance the overall processing speed of the apparatus.

On the other hand, available industrial technology limits the extent of enhancing the scale of circuit integration and, from the viewpoint of economic optimization, the plurality of functional blocks constituting an electronic apparatus are divided into a plurality of LSI chips, which are arranged in high density to minimize the distances between them and thereby to increase the processing speed of the apparatus.

In particular, what consist of bare LSI chips, not encased, installed on a small wiring board at minimized spacing are known as an LSI package (typical of which is a multi-chip module, abbreviated to MCM). This configuration is being increasingly applied as a technique to reduce the wiring distances between LSI chips and thereby to effectively achieve faster processing by electronic apparatuses. One example is disclosed in Rao R. Tummala et al., *Microelectronics Packaging Handbook*, 1989, Van Nostrand Reinhold, pp. 786–790.

In such an LSI package, circuits linking LSI chips, which should ideally be accommodated within the LSI chips themselves, span the spaces between the LSI chips, and accordingly are required to permit significantly high speed. At present, square wave signals of tens to hundreds of MHz are used for transfers over these circuits.

To drive such LSI chip circuits in an LSI package, emitter coupled logic (ECL) output circuits of emitter follower type or gunning terminal logic (GTL) output circuits of source follower type, both capable of operating at high speed and having a large load driving capacity, are used.

In signal wiring connected to such output circuits (ECL circuits and GTL circuits), reflection occurs at ends, and transferred signals are distorted by multiple reflection. Therefore, in high speed signal transfers, signal wiring should be terminated with intrinsic impedances.

In an LSI package, generally, 10 to 100 LSI chips are mounted on a wiring board. As the wiring board is rectangular, having 6 to 15 cm long sides, the signal wiring length between LSI chips is 10 to 30 cm. Accordingly, when driving with LSI chips whose pulse rise characteristic is no more than 1 ns, terminal resistors are indispensable.

According to the prior art, such terminal resistors are either arranged on the wiring board surface as independent chips along with LSI chips or formed in advance on the wiring board as described in the Gazette of the Japanese Patent Laid-open No. 119047 of 1989 or that of the Japanese Patent Laid-open No. 227561 of 1991.

As stated above, terminal resistors provided on an LSI package, according to the prior art, are either arranged on the wiring board surface as independent chips along with LSI chips or formed in advance on the wiring board.

As the corresponding area of the wiring board surface is occupied by the terminal resistance elements in either of these manners, the distances either between adjoining LSI chips or between the terminal resistors and input/output circuits of the LSI chips are extended, resulting in cumbrance to high speed signal transfers. Therefore, the prior art involves the problem that the benefit of using an LSI package in an electronic apparatus (the benefit of increasing the processing speed of the electronic apparatus in which the LSI package is used) cannot be fully realized.

An object of the present invention is to provide, in view of the above-stated problem, an LSI package (LSI package with built-in terminal resistors), typically an MCM, which makes it possible to reduce the area of the wiring board surface occupied by terminal resistors, to position the terminal resistors close to input/output terminals of LSI chips and thereby to transfer signals at high speed. Another object of the invention is to provide a method to manufacture such LSI packages with built-in terminal resistors.

SUMMARY OF THE INVENTION

According to one aspect of the invention, there is provided an LSI package comprising: a wiring board whose main insulating material is either ceramic or glass-ceramic; terminal resistance elements buried in a direction to penetrate said wiring board and formed by sintering resistive paste consisting of a mixture of fine powder of either oxidized metal or carbon and fine powder of glass; front side wiring, formed on the front face of said wiring board and within the top layer of said wiring board, to connect the parts of said terminal resistance elements exposed on the front face of said wiring board to input/output circuits of LSI chips mounted on the front face of said wiring board; and back side wiring, formed on the back face of said wiring board, to connect the parts of said terminal resistance elements exposed on the back face of said wiring board to a voltage clamp wiring network.

An LSI package according to the invention may as well have such a configuration that the constituent elements mentioned above are augmented with thin-film resistance elements formed either midway on the front side wiring and on the front face of the wiring board or midway on the back side wiring and connected to the terminal resistance elements either in series or in parallel to be used for trimming of the terminal resistance values.

According to another aspect of the invention, there is provided a method to manufacture an LSI package comprising: a terminal resistor array green sheet preparing step to form terminal resistor array green sheets by printing resistive paste, which is to constitute terminal resistance elements, over green sheets composed of the same material as that of green sheets constituting a wiring board, and drying it; a green sheet burying step to bury in the wiring board manufacturing process the terminal resistor array green sheets, formed at said terminal resistor array green sheet preparing step, into the wiring board in a direction normal to the layer stacking direction of the green sheets in the wiring board; and a sintering step to bake and sinter the terminal resistance array green sheets, buried into the wiring board green sheets at said green sheet burying step, together with the wiring board green sheets.

An LSI package manufacturing method according to the invention may as well have, in addition to the above-described steps, a thin-film resistance element forming step to prepare, by a process of thin-film formation from either metal films or oxidized metal films, thin-film resistance elements to be formed on the front face of a wiring board; a resistor connecting step to connect, either in series or in parallel to the terminal resistance elements formed in the wiring board at said sintering step, the thin-film resistance elements prepared at said thin-film resistance element forming step to a "circuit connecting input/output circuits of LSI chips to a voltage clamp wiring network"; and a trimming step to trim the composite resistance values of the terminal resistance elements and the thin-film resistance elements to the desired terminal resistance values by altering either physically or chemically either the dimensions or the electric resistivities of the thin-film resistance elements.

BRIEF DESCRIPTION OF THE DRAWINGS

Other features and advantages of the present invention will become more apparent from the following detailed description when taken in conjunction with the accompanying drawings, wherein.

DETAILED DESCRIPTION OF THE PREFERRED EMBODIMENTS

Next will be described the present invention in detail with reference to drawings.

Figure 1:
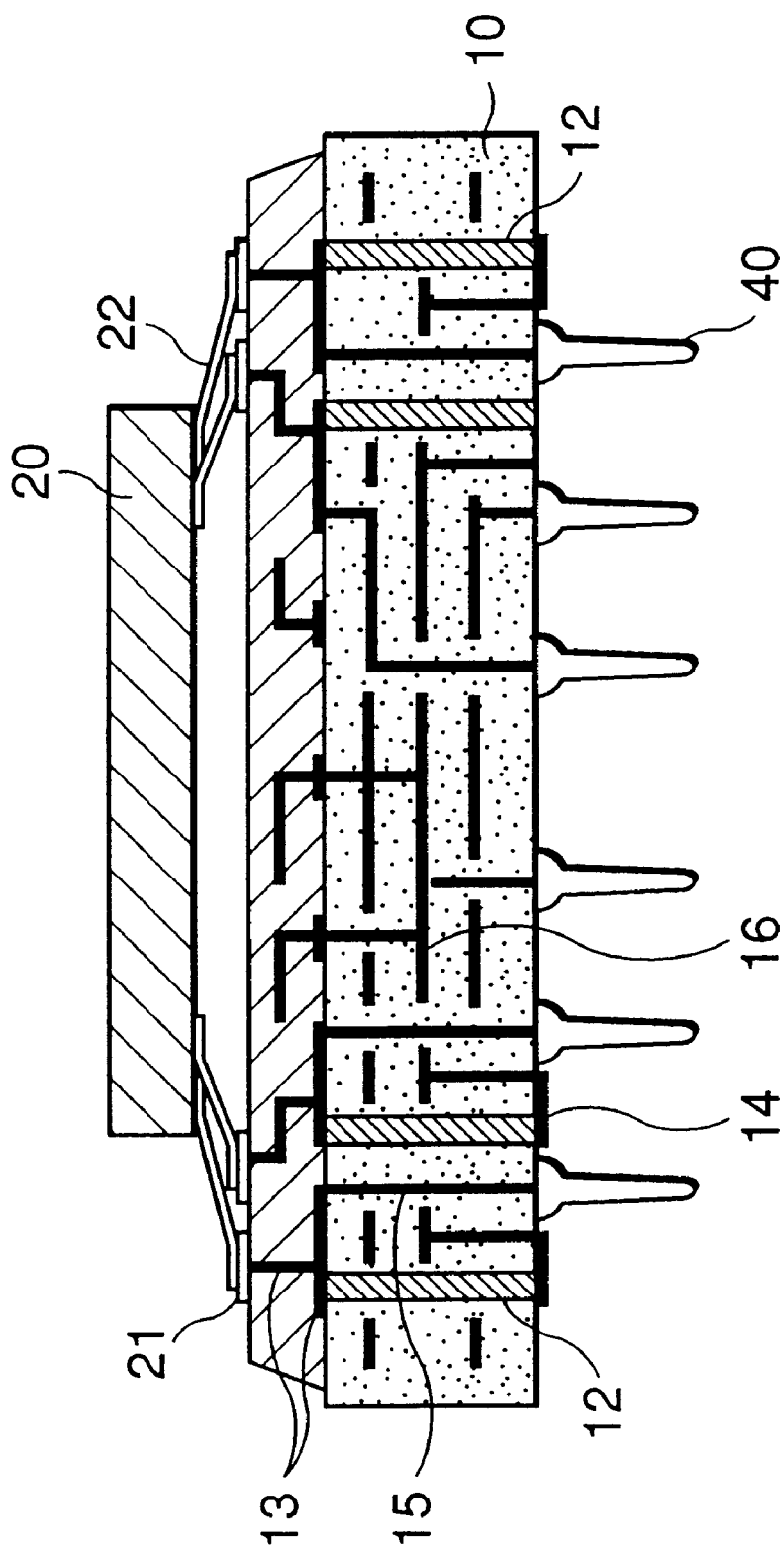
FIG. 1 shows a cross-sectional view of an LSI package which is a first preferred embodiment of the invention.
Figure 3:
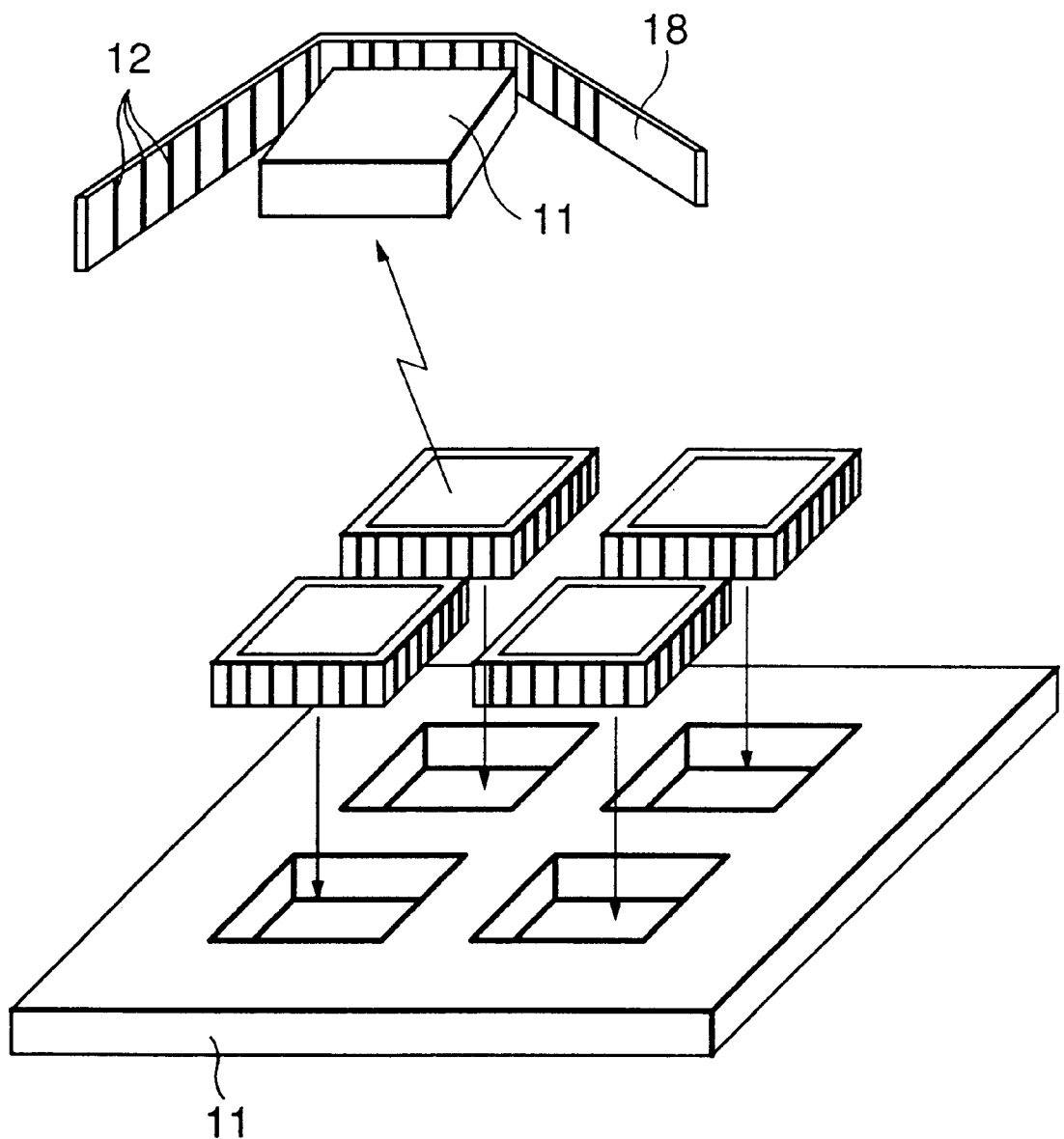
FIG. 3 illustrates a first preferred example of LSI package manufacturing method according to the invention.

Referring to FIG. 1, an LSI package which is a first preferred embodiment of the present invention comprises a ceramic wiring board 10 formed by stacking ceramic green sheets 11 shown in FIG. 3; terminal resistance elements 12; front side wiring 13 (wiring formed on the front face of the ceramic wiring board 10 and within the top layer of the ceramic wiring board 10); back side wiring 14 (wiring formed on the back face of the ceramic wiring board 10); throughholes 15; a voltage clamp wiring network 16; an LSI chip 20; connecting terminals 21; leads 22; and input/output pins 40. Although the wiring board in this embodiment is a ceramic wiring board 10, the invention can as well be realized with a glass-ceramic wiring board. This LSI package has intralayer wiring within the ceramic wiring board 10 (however, the idea of the invention can be applied irrespective of the presence or absence of intra-layer wiring; the same applies to a second preferred embodiment to be described below).

Next will be described structural features of this embodiment with reference to FIG. 1.

This embodiment has structural features (including operational features) as described in (1) through (4) below.

(1) In the ceramic wiring board 10, consisting of stacked ceramic green sheets 11, are buried the terminal resistance elements 12. The direction in which the terminal resistance elements 12 are buried in the ceramic wiring board 10 is the direction in which the ceramic wiring board 10 is penetrated (the direction from the front toward the back face of the ceramic wiring board 10). The terminal resistance elements 12 are formed by sintering resistive paste consisting of a mixture of fine powder of oxidized metal or carbon and fine glass powder.

(2) One end of each terminal resistance element 12 is exposed on the front face of the ceramic wiring board 10, and connected to an input/output circuit of an LSI chip 20 (an LSI chip 20 to be mounted on the front face of the ceramic wiring board 10) via the front side wiring 13, a connecting terminal 21 and a lead 22.

(3) The other end of each terminal resistance element 12 is exposed on the back face of the ceramic wiring board 10, and connected to the voltage clamp wiring network 16 via the back side wiring 14 and a throughhole 15.

(4) The LSI chips 20 mounted on the ceramic wiring board 10 are ECL circuits, and the whole signal wiring in and out of the ceramic wiring board 10 has dimensions to make its intrinsic impedance 50 ohms, and the terminal resistance elements 12 also have a design value of 50 ohms, though this impedance value is merely one example.

Figure 2:
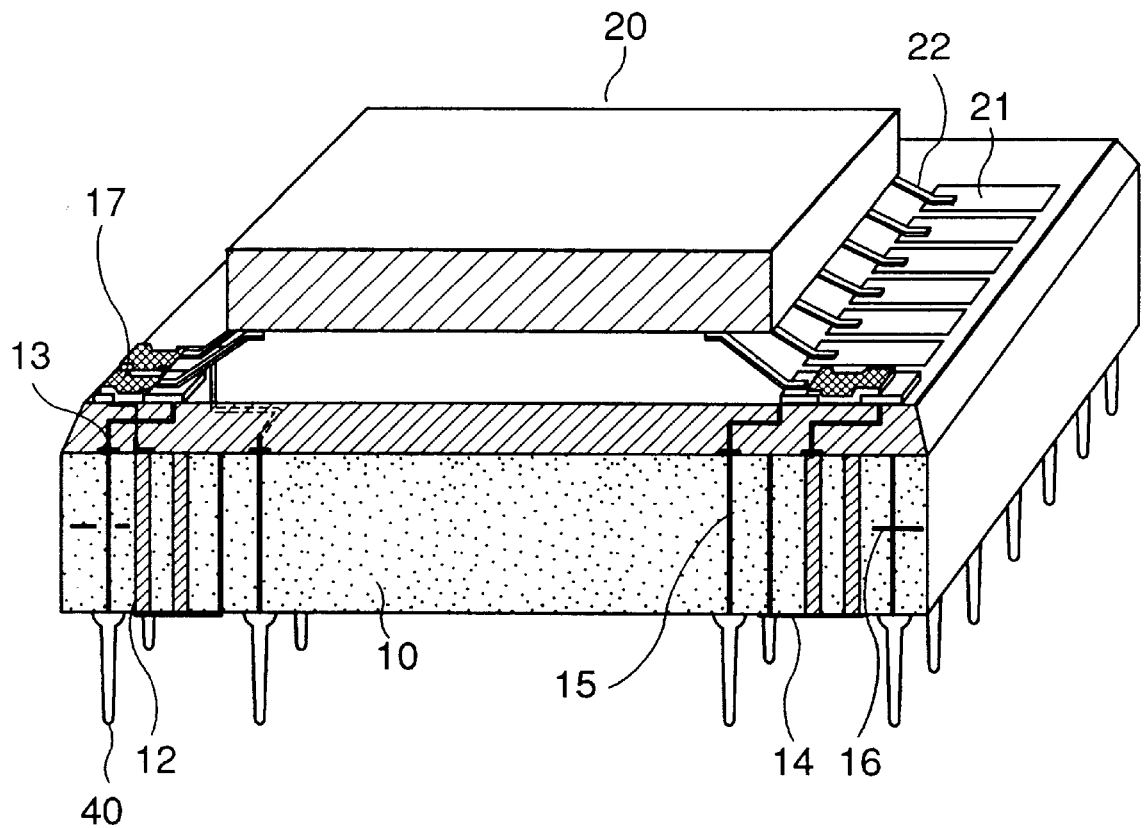
FIG. 2 shows a perspective view of a partial cross section of an LSI package which is a second preferred embodiment of the invention.

FIG. 2 shows an overhead view of a cross section of the structure of another LSI package which is a second preferred embodiment of the present invention.

This LSI package comprises a ceramic wiring board 10 formed by stacking ceramic green sheets 11; terminal resistance elements 12; front side wiring 13; back side wiring 14; throughholes 15; a voltage clamp wiring network 16; an LSI chip 20; connecting terminals 21; leads 22; and input/output pins 40. Although the wiring board in this embodiment is a ceramic wiring board 10, the invention can as well be realized with a glass-ceramic wiring board.

Next will be described structural features of this embodiment with reference to FIG. 2.

This embodiment has structural features (including operational features) as described in (1) through (5) below.

(1) In the ceramic wiring board 10, consisting of stacked ceramic green sheets 11, are buried the terminal resistance elements 12. The direction in which the terminal resistance elements 12 are buried in the ceramic wiring board 10 is the direction in which the ceramic wiring board 10 is penetrated. The terminal resistance elements 12 are formed by sintering resistive paste consisting of a mixture of fine powder of oxidized metal or carbon and fine glass powder. This embodiment is the same as the first embodiment in these respects.

(2) One end of each terminal resistance element 12 (the end exposed on the front face of the ceramic wiring board 10) is connected, in the front side wiring 13 formed on the front face of the ceramic wiring board 10, to a thin-film resistance element 17 formed on the front face of the ceramic wiring board 10. Thus the thin-film resistance element 17 is formed "in a position midway on the front side wiring 13 and on the front face of the ceramic wiring board 10." Incidentally, the position where the thin-film resistance element 17 is to be formed may as well be, other than the position specified for this embodiment, "a position midway on the back side wiring 14."

(3) The end of the terminal resistance element 12 connected to a thin-film resistance element 17 as described in (2) is further connected to an input/output circuit of an LSI chip 20 via the thin-film resistance element 17, a connecting terminal 21 and a lead 22.

(4) The other end of each terminal resistance element 12 is exposed on the back face of the ceramic wiring board 10, and connected to the voltage clamp wiring network 16 via the back side wiring 14 and a throughhole 15. Thus the connecting terminals 21 pertaining to the LSI chip 20 are terminated by the series resistance of the thin-film resistance elements 17 and the terminal resistance elements 12.

(5) The LSI chips 20 mounted on the ceramic wiring board 10 are ECL circuits, and the whole signal wiring in and out of the ceramic wiring board 10 has dimensions to make its intrinsic impedance 50 ohms, and the terminal resistance elements 12 also have a design value of 50 ohms, though this impedance value is merely one example.

Next will be explained "the presence of thin-film resistance elements 17," a characteristic aspect of the LSI package which is the second preferred embodiment of the present invention, as distinguished from the first preferred embodiment.

The terminal resistance elements 12, buried in the ceramic wiring board 10, are formed in a so-called thick-film process, in which resistance paste consisting of a mixture of fine powder of oxidized metal or carbon and fine glass powder is printed and sintered. Therefore, their resistance values may deviate from the design value by about 10% on account of manufacturing inaccuracy.

For this LSI package, like the first embodiment, the intrinsic impedance of signal wiring is 50 ohms everywhere. Accordingly, in order to transfer square wave signals over signal wiring of 30 cm or more in length at a frequency of 200 MHz or more, the tolerance of the terminal resistance should be kept within 1% approximately.

For the first embodiment, to satisfy this requirement (the requirement that the terminal resistance should be kept within 1% approximately), the precision of the resistance of the terminal resistance elements 12 should be improved. However, the resistance values of terminal resistance elements 12 are usually subject to deviation due to manufacturing inaccuracy.

By contrast, this (second) embodiment can meet the aforementioned requirement with the combination of the terminal resistance elements 12 and the thin-film resistance elements 17.

Thus, for the resistance of the terminal resistance elements formed by a thick-film process and buried in the ceramic wiring board 10, a design central value of 44 ohms is assigned with fluctuations from 40 to 48 ohms tolerated. Instead, the resistance of the thin-film resistance elements 17 provided on the front face of the ceramic wiring board 10 is trimmed to between 2 and 10 ohms, so that the errors of the terminal resistance can be kept within 1%.

Regarding the power to be withstood by the terminal resistance, 80% or more of it can be borne by the terminal resistance elements 12 in the ceramic wiring board 10, so that the thin-film resistance elements need to bear no more than 20%. Accordingly, in meeting the accuracy requirement as stated above, the area occupied by resistors on the front face of the ceramic wiring board 10 (the thin-film resistance elements 17) can be reduced, and no great area needs to be allocated on the front face of the ceramic wiring board 10 for occupancy by the resistance elements.

To add, though this LSI package is superior to the first embodiments in these respects, the first embodiment can be fully useful for practical purposes depending on various characteristic values (including the impedance and the frequency) of the LSI package.

Furthermore, though the second embodiment described above has its terminal resistance elements 12 and thin-film resistance elements 17 connected in series, they can as well be connected in parallel and the terminal resistance value set accordingly.

FIG. 3 illustrates a first preferred example of LSI package manufacturing method according to the present invention. It shows an overall view of a terminal resistor array green sheet 18 on which terminal resistance elements 12 are printed and arranged in a row (a green sheet of the same material as the ceramic green sheets which constitute the ceramic wiring board 10, which is the main wiring board) and the manner in which the terminal resistor array green sheets 18 are buried in a ceramic green sheet 11 of the ceramic wiring board 10.

Next will be described the process of this LSI package manufacturing method.

This LSI package manufacturing method has the following steps (1) through (3).

(1) Terminal resistor array green sheet forming step

Before the step to manufacture the ceramic wiring board 10 composed by stacking ceramic green sheets 11, terminal resistor array green sheets 18, consisting of strips of resistive paste (the resistive paste which is to constitute the terminal resistance elements 12) arranged in a row on a ceramic green sheet 11, are formed in advance (see FIG. 3). Thus, the terminal resistor array green sheets 18 are formed by printing the strips of resistive paste, which are to constitute the terminal resistance elements 12, on green sheets consisting of the same material as that of the green sheets constituting the ceramic wiring board 10 (ceramic green sheets 11), and drying them.

(2) Green sheet burying step

The terminal resistor array green sheets 18, prepared at the terminal resistor array green sheet forming step of (1), are buried around LSI chip mounting areas of the ceramic wiring board 10 so that the terminal resistance elements 12 be arranged in the direction of penetrating the ceramic wiring board 10. Thus, in this manufacturing process of the ceramic wiring board 10, the terminal resistor array green sheets 18 are buried in a direction normal to the stacking direction of the ceramic green sheets 11 in the ceramic wiring board 10.

(3) Sintering step

The terminal resistor array green sheets 18, buried in th e green sheets of the ceramic wiring board 10 (ceramic green sheets 11) at the green sheet burying step of (2), are baked and sintered together (simultaneously) with the ceramic wiring board 10 (ceramic green sheets 11).

The above-described sequence of steps enables the LSI package, which is the first preferred embodiment of the present invention (see FIG. 1), to be manufactured.

In an LSI package manufactured in this manner, one end of each terminal resistance element 12 is exposed on the front face of the ceramic wiring board 10 and connected to an input/output circuit of an LSI chip 20, and the other end of each terminal resistance element 12 is connected to a voltage clamp wiring network 16. This arrangement provides terminal resistors around each LSI chip 20.

Obviously, the wiring board need not be a ceramic wiring board 10 but may as well be a glass-ceramic wiring board. In this case, the terminal resistor array green sheets 18 should also be made of a glass-ceramic material.

In a second preferred example of LSI package manufacturing method according to the invention, the following processing steps (4) through (6) are taken in addition to steps (1) through (3) of the first example.

(4) Thin-film resistance element forming step

Thin-film resistance elements 17 (see FIG. 2) to be formed on the front face of the ceramic wiring board 10 are prepared in a thin-film process for films of metal or oxidized metal. The thin-film process may typically be vacuum evaporation or sputtering.

(5) Resistor connecting step

The thin-film resistance elements 17 prepared at the thin-film resistance element forming step of (4) are connected to "circuits to link input/output circuits of LSI chips 20 and the voltage clamp wiring network 16" in a manner of series ("series" here, but may as well be "parallel") connection to the terminal resistance elements formed in the ceramic wiring board 10 at the sintering step of (3).

(6) Trimming step

Either the dimensions or the electric resistivity of the thin-film resistance elements 17 are altered either physically or chemically (by grinding, cutting, irradiation with laser or the like). The composite resistance of the terminal resistance elements 12 and the thin-film resistance elements 17 is thereby trimmed to the desired terminal resistance.

This sequence of steps (4) through (6) makes it possible to realize terminals of high precision and thereby enables the above-described LSI package, which is the second preferred embodiment of the present invention (see FIG. 2), to be manufactured.

Figure 4:
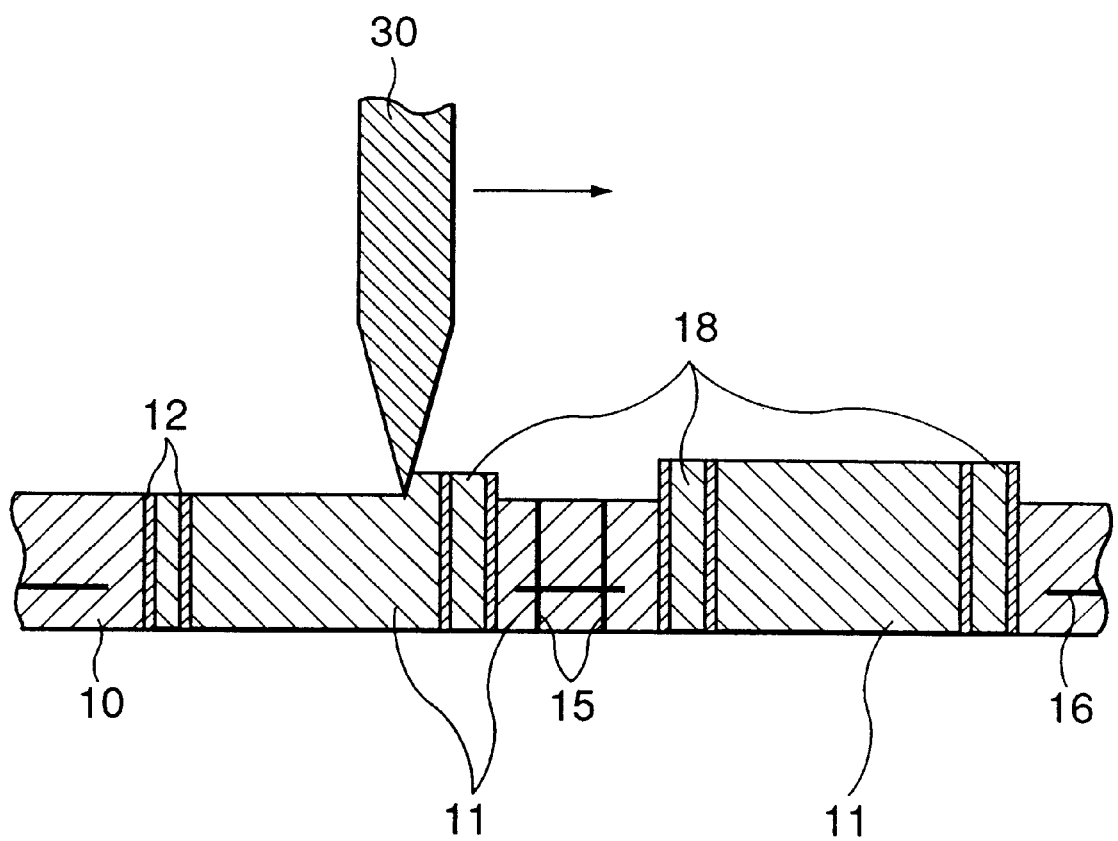
FIG. 4 illustrates a third preferred example of LSI package manufacturing method according to the invention.

FIG. 4 illustrates a third preferred example of LSI package manufacturing method according to the present invention.

This example of LSI package manufacturing method additionally includes the processing of (2') below between the green sheet burying step of (2) and the sintering step of (3) of the above-described first or second example.

(2') Flattening step

In advance of the baking of the ceramic wiring board 10, the unevenness of the front and back faces of the ceramic wiring board 10, in which the terminal resistor array green sheets 18 are buried, is removed with a doctor blade 30. Thus, the bulging-out parts of the terminal resistor array green sheets 18, buried in the ceramic wiring board 10, are scraped off with the doctor blade 30 to flatten the whole front and back faces of the ceramic wiring board 10, in which the terminal resistor array green sheets 18 are buried (FIG. 4 shows a cross-sectional view of the manner in which the flattening is accomplished).

The raison d'être of this flattening step consists in the following respect. To the ceramic wiring board 10 are soldered LSI chips 20 and various other elements to be mounted on the surface. For efficient washing after the soldering, it is desirable for the surface of the board (the front and back faces of the ceramic wiring board 10) to be flat. Here lies the meaning of forming a ceramic wiring board 10 of which both the front and the back faces are smooth by flattening the two faces of the ceramic wiring board 10, in which the terminal resistor array green sheets 18 are buried.

As hitherto described, the present invention provides the following benefits.

The first is the benefit of making it possible to realize termination in the vicinities of input/output circuits of LSI chips and thereby to shorten the distances between terminal resistors and input/output circuits of LSI chips. The reason for this benefit is that, according to the invention, the terminal resistance elements are built into the LSI package in the direction of penetrating the wiring board.

The second is the benefit of reducing the length of signal wiring to connect LSI chips to one another because the distances between adjoining LSI chips can be reduced and accordingly a plurality of LSI chips can be arranged in high density. The reason for this benefit is that, according to the invention, terminal resistance elements occupy virtually no parts of the front and back faces of the wiring board (since greater parts of the terminal resistance elements are formed within the wiring board, its surface is scarcely occupied).

These first and second benefits enhance the terminal effect of the signal wiring, enable signals to be transferred at high speed, and make it possible to truly realize the advantage of using an LSI package that "the use of an LSI package in an electronic apparatus serves to increase the speed of processing in that electronic apparatus."

The third is the benefit of reducing the cost of an LSI package having terminal resistance elements of the desired level of precision in the desired number. A reason for this benefit is that an LSI package manufacturing method according to the invention enables terminal resistance elements to be formed in an inexpensive thick-film process and, moreover, by simultaneous baking with the wiring board. An additional reason, regarding the guarantee of precision, is that the second example of LSI package manufacturing method according to the invention makes it possible to trim the terminal resistance values with small thin-film resistance elements.

What is claimed is:

1. A method to manufacture an LSI package comprising a wiring board having green sheets, and terminal resistance elements said method comprising:

forming at least one terminal resistor array green sheet by printing resistive paste, which is to constitute terminal resistance elements, over a green sheet composed of the same material as that of green sheets constituting the wiring board, and drying it;

burying said at least one terminal resistor array green sheet, formed at said terminal resistor array green sheet forming step, into the wiring board in a direction normal to the direction the green sheets in the wiring board are stacked; and sintering to bake and sinter the at least one terminal resistance array green sheet, buried into the wiring board green sheets, together with the wiring board green sheets.

2. An LSI package manufacturing method, said LSI package comprising a wiring board having green sheets, and terminal resistance elements, comprising:

forming at least one terminal resistor array green sheet by printing resistive paste, which is to constitute terminal resistance elements, over a green sheet composed of the same material as that of green sheets constituting the wiring board, and drying it;

burying said at least one terminal resistor array green sheet, formed at said terminal resistor array green sheet forming step, into the wiring board in a direction normal to the direction the green sheets in the wiring board are stacked;

sintering to bake and sinter the at least one terminal resistance array green sheet buried into the wiring board green sheets, together with the wiring board green sheets;

forming thin-film resistance elements, from either metal films or oxidized metal films, on a front face of the wiring board;

connecting the terminal resistance elements and the thin-film resistance elements to a circuit connecting input/output circuits of LSI chips to a voltage clamp wiring network; and trimming the composite resistance values of the terminal resistance elements and the thin-film resistance elements to desired terminal resistance values by altering either physically or chemically either the dimensions or the electric resistivities of the thin-film resistance elements.

3. An LSI package manufacturing method, as claimed in claim 1, additionally having a flattening step to remove with a doctor blade bulging-out parts of front and back faces of the wiring board in advance of the sintering of said wiring board.

4. An LSI package manufacturing method as claimed in claim 2, additionally having a flattening step to remove with a doctor blade the bulging-out parts of front and back faces of the wiring board in advance of the sintering of said wiring board.

* * * * *